US006956763B2

(12) United States Patent
Akerman et al.

(10) Patent No.: US 6,956,763 B2
(45) Date of Patent: Oct. 18, 2005

(54) MRAM ELEMENT AND METHODS FOR WRITING THE MRAM ELEMENT

(75) Inventors: Bengt J. Akerman, Mesa, AZ (US); Mark F. Deherrera, Tempe, AZ (US); Bradley N. Engel, Chandler, AZ (US); Nicholas D. Rizzo, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/609,288

(22) Filed: Jun. 27, 2003

(65) Prior Publication Data

US 2004/0264238 A1 Dec. 30, 2004

(51) Int. Cl.[7] ................................................ G11C 11/00
(52) U.S. Cl. ....................................... 365/158; 365/171
(58) Field of Search ................................. 365/158, 171

(56) References Cited

U.S. PATENT DOCUMENTS

| | | |
|---|---|---|
| 3,163,853 A | 12/1964 | Belson |
| 3,448,438 A | 6/1969 | Hansen et al. |
| 3,573,760 A | 4/1971 | Chang et al. |

(Continued)

FOREIGN PATENT DOCUMENTS

| | | |
|---|---|---|
| DE | 43 27 458 | 8/1993 |
| DE | 198 30 343 | 7/1998 |
| EP | 0 068 760 | 10/1985 |

(Continued)

OTHER PUBLICATIONS

Pohm et al., "Analysis of 0.1 to 0.3 Micron Wide, Ultra Dense GMR. Memory Elements," IEEE Transactions on Magnetics, Bd. 30, Nr. 6, Nov. 1994, 4650–4652.

Pohm et al., "The Architecture of a High Performance Mass Store with GMR Memory Cells," IEEE Transactions on Magnetics, Bd. 31, Nr. 6, Nov. 1995, 3200–3202.

(Continued)

*Primary Examiner*—M. Tran
(74) *Attorney, Agent, or Firm*—Ingrassia, Fisher & Lorenz

(57) ABSTRACT

A direct write is provided for a magnetoelectronics information device that includes producing a first magnetic field with a first field magnitude in proximity to the magnetoelectronics information device at a first time ($t_1$). Once this first magnetic field with the first magnitude is produced, a second magnetic field with a second field magnitude is produced in proximity to the magnetoelectronics information device at a second time ($t_2$). The first magnetic field is adjusted to provide a third magnitude at a third time ($t_3$) that is less than the first field magnitude and greater than zero, and the second magnetic field is adjusted to provide a fourth field magnitude at a fourth time ($t_4$) that is less than the second field magnitude. This direct write is used in conjunction with other direct writes and also in combination with toggle writes to write the MRAM element without an initial read.

33 Claims, 7 Drawing Sheets

U.S. PATENT DOCUMENTS 3,638,199 A 1/1972 Kolankowsky et al.
3,707,706 A 12/1972 Kefalas
3,913,080 A 10/1975 Leo et al.
4,103,315 A 8/1978 Hempstead et al.
4,351,712 A 9/1982 Cuomo et al.
4,356,523 A 10/1982 Yeh
4,455,626 A 6/1984 Lutes
4,556,925 A 12/1985 Suenaga et al.
4,663,685 A 5/1987 Tsang
4,719,568 A 1/1988 Carrubba et al.
4,731,757 A 3/1988 Daughton et al.
4,751,677 A 6/1988 Daughton et al.
4,754,431 A 6/1988 Jenson
4,780,848 A 10/1988 Daughton et al.
4,825,325 A 4/1989 Howard
4,884,235 A 11/1989 Thiele
5,039,655 A 8/1991 Pisharody
5,075,247 A 12/1991 Matthews
5,159,513 A 10/1992 Dieny et al.
5,173,873 A 12/1992 Wu et al.
5,258,884 A 11/1993 Howard et al.
5,268,806 A 12/1993 Goubau et al.
5,284,701 A 2/1994 Hamon
5,285,339 A 2/1994 Chen et al.
5,301,079 A 4/1994 Cain et al.
5,329,486 A 7/1994 Lage
5,343,422 A 8/1994 Kung et al.
5,346,302 A 9/1994 Ryu
5,347,485 A 9/1994 Taguchi et al.
5,348,894 A 9/1994 Gnade et al.
5,349,302 A 9/1994 Cooper
5,361,226 A 11/1994 Taguchi et al.
5,375,082 A 12/1994 Katti et al.
5,396,455 A 3/1995 Brady et al.
5,398,200 A 3/1995 Mazure et al.
5,408,377 A 4/1995 Gurney et al.
5,420,819 A 5/1995 Pohm
5,432,734 A 7/1995 Kawano et al.
5,442,508 A 8/1995 Smith
5,448,515 A 9/1995 Fukami et al.
5,452,243 A 9/1995 Ansel et al.
5,468,985 A 11/1995 Harima
5,475,825 A 12/1995 Yonezawa et al.
5,477,842 A 12/1995 Maruyama et al.
5,496,759 A 3/1996 Yue et al.
5,498,561 A 3/1996 Sakuma et al.
5,528,440 A 6/1996 Fontana et al.
5,534,355 A 7/1996 Okuno et al.
5,534,793 A 7/1996 Nasserbakht
5,541,868 A 7/1996 Prinz
5,567,523 A 10/1996 Rosenblum et al.
5,569,617 A 10/1996 Yeh et al.
5,585,986 A 12/1996 Parkin
5,587,943 A 12/1996 Torok et al.
5,617,071 A 4/1997 Daughton
5,636,093 A 6/1997 Gijs et al.
5,640,343 A 6/1997 Gallagher et al.
5,650,958 A 7/1997 Gallagher et al.
5,659,499 A 8/1997 Chen et al.
5,661,062 A 8/1997 Prinz
5,673,162 A 9/1997 Saito
5,699,293 A 12/1997 Tehrani et al.
5,702,831 A 12/1997 Chen et al.
5,712,612 A 1/1998 Lee et al.
5,715,121 A 2/1998 Sakakima et al.
5,729,410 A 3/1998 Fontana, Jr. et al.
5,732,016 A 3/1998 Chen et al.
5,734,605 A 3/1998 Zhu et al.
5,745,408 A 4/1998 Chen et al.
5,748,519 A 5/1998 Tehrani et al.
5,757,056 A 5/1998 Chui
5,761,110 A 6/1998 Irrinki et al.
5,764,567 A 6/1998 Parkin
5,766,743 A 6/1998 Fujikata et al.
5,768,181 A 6/1998 Zhu et al.
5,774,394 A 6/1998 Chen et al.
5,774,404 A 6/1998 Eto
5,786,275 A 7/1998 Kubo
5,801,984 A 9/1998 Parkin
5,804,250 A 9/1998 Yang
5,804,485 A 9/1998 Liang
5,825,685 A 10/1998 Yamane et al.
5,828,578 A 10/1998 Blomgren
5,831,920 A 11/1998 Chen et al.
5,832,534 A 11/1998 Sing et al.
5,835,314 A 11/1998 Moodera et al.
5,838,608 A 11/1998 Zhu et al.
5,852,574 A 12/1998 Naji
5,856,008 A 1/1999 Cheong et al.
5,861,326 A 1/1999 Tehrani et al.
5,892,708 A 4/1999 Pohm
5,894,447 A 4/1999 Takashima
5,898,612 A 4/1999 Chen et al.
5,902,690 A 5/1999 Tracy et al.
5,905,996 A 5/1999 Pawlowski
5,907,784 A 5/1999 Larson
5,917,749 A 6/1999 Chen et al.
5,920,500 A 7/1999 Tehrani et al.
5,926,414 A 7/1999 McDowell et al.
5,930,164 A 7/1999 Zhu
5,932,343 A 8/1999 Hayashi et al.
5,940,319 A 8/1999 Durlam et al.
5,943,284 A 8/1999 Mizuno et al.
5,943,574 A 8/1999 Tehrani et al.
5,946,227 A 8/1999 Naji
5,946,228 A 8/1999 Abraham et al.
5,948,553 A 9/1999 Kamijo
5,949,622 A 9/1999 Kamiguchi et al.
5,949,696 A 9/1999 Threewitt
5,953,248 A 9/1999 Chen et al.
5,955,211 A 9/1999 Maeda et al.
5,956,267 A 9/1999 Hurst et al.
5,959,880 A 9/1999 Shi et al.
5,966,012 A 10/1999 Parkin
5,966,323 A 10/1999 Chen et al.
5,976,713 A 11/1999 Fuke et al.
5,978,257 A 11/1999 Zhu et al.
5,982,660 A 11/1999 Bhattacharyya
5,985,356 A 11/1999 Schultz et al.
5,985,365 A 11/1999 Jaye
5,986,858 A 11/1999 Sato et al.
5,986,925 A 11/1999 Naji et al.
5,990,011 A 11/1999 McTeer
5,998,040 A 12/1999 Nakatani et al.
6,004,654 A 12/1999 Shinjo et al.
6,005,753 A 12/1999 Fontana, Jr. et al.
6,016,269 A 1/2000 Peterson et al.
6,023,395 A 2/2000 Dill et al.
6,048,739 A 4/2000 Hurst et al.
6,052,302 A 4/2000 Moyer et al.
6,052,303 A 4/2000 Chevallier et al.
6,054,226 A 4/2000 Takeda et al.
6,055,178 A 4/2000 Naji
6,055,179 A 4/2000 Koganei et al.
6,069,820 A 5/2000 Inomata et al.
6,072,718 A 6/2000 Abraham et al.
6,083,764 A 7/2000 Chen
6,097,625 A 8/2000 Scheuerlein
6,097,626 A 8/2000 Brug et al.
6,111,784 A 8/2000 Nishimura
6,114,719 A 9/2000 Dill et al.

| | | | | |
|---|---|---|---|---|
| 6,120,842 | A | | 9/2000 | Lu et al. |
| 6,127,045 | A | | 10/2000 | Gill |
| 6,134,060 | A | | 10/2000 | Ryat |
| 6,134,139 | A | | 10/2000 | Bhattacharyya et al. |
| 6,145,055 | A | | 11/2000 | Fujimoto |
| 6,163,477 | A | | 12/2000 | Tran |
| 6,165,803 | A | | 12/2000 | Chen et al. |
| 6,166,948 | A | | 12/2000 | Parkin et al. |
| 6,169,687 | B1 | | 1/2001 | Johnson |
| 6,169,689 | B1 | | 1/2001 | Naji |
| 6,172,903 | B1 | | 1/2001 | Nishimura |
| 6,175,475 | B1 | | 1/2001 | Lin et al. |
| 6,175,515 | B1 | | 1/2001 | Peczalski et al. |
| 6,178,074 | B1 | | 1/2001 | Gill |
| 6,178,112 | B1 | | 1/2001 | Bessho et al. |
| 6,180,444 | B1 | | 1/2001 | Gates et al. |
| 6,185,143 | B1 | | 2/2001 | Perner et al. |
| 6,188,549 | B1 | | 2/2001 | Wiitala |
| 6,189,077 | B1 | | 2/2001 | Robertson et al. |
| 6,191,972 | B1 | | 2/2001 | Miura et al. |
| 6,195,240 | B1 | | 2/2001 | Gill |
| 6,198,610 | B1 | | 3/2001 | Kawawake et al. |
| 6,205,051 | B1 | | 3/2001 | Brug et al. |
| 6,205,052 | B1 | | 3/2001 | Slaughter et al. |
| 6,205,073 | B1 | | 3/2001 | Naji |
| 6,211,090 | B1 | | 4/2001 | Durlam et al. |
| 6,232,777 | B1 | | 5/2001 | Sato et al. |
| 6,233,172 | B1 | | 5/2001 | Chen et al. |
| 6,249,406 | B1 | | 6/2001 | Gill et al. |
| 6,256,247 | B1 | | 7/2001 | Perner |
| 6,259,586 | B1 | | 7/2001 | Gill |
| 6,269,018 | B1 | | 7/2001 | Monsma et al. |
| 6,269,040 | B1 | | 7/2001 | Reohr et al. |
| 6,277,762 | B1 | | 7/2001 | Hwang |
| 6,278,631 | B1 | | 7/2001 | Naji |
| 6,281,538 | B1 | | 7/2001 | Slaughter |
| 6,272,040 | B1 | | 8/2001 | Salter et al. |
| 6,275,363 | B1 | | 8/2001 | Gill |
| 6,285,581 | B1 | | 9/2001 | Tehrani et al. |
| 6,292,336 | B1 | | 9/2001 | Horng et al. |
| 6,292,389 | B1 | | 9/2001 | Chen et al. |
| 6,295,225 | B1 | | 9/2001 | Oepts |
| 6,313,973 | B1 | | 11/2001 | Fuke et al. |
| 6,314,020 | B1 | | 11/2001 | Hansen et al. |
| 6,317,299 | B1 | | 11/2001 | Pinarbasi |
| 6,317,376 | B1 | | 11/2001 | Tran et al. |
| 6,322,640 | B1 | | 11/2001 | Xiao et al. |
| 6,330,137 | B1 | | 12/2001 | Knapp et al. |
| 6,331,943 | B1 | | 12/2001 | Naji et al. |
| 6,331,944 | B1 | | 12/2001 | Monsma et al. |
| 6,338,899 | B1 | | 1/2002 | Fukuzawa et al. |
| 6,341,053 | B1 | | 1/2002 | Nakada et al. |
| 6,341,084 | B2 | | 1/2002 | Numata et al. |
| 6,343,032 | B1 | | 1/2002 | Black et al. |
| 6,344,954 | B1 | | 2/2002 | Redon et al. |
| 6,351,408 | B1 | | 2/2002 | Schwarzl et al. |
| 6,351,409 | B1 | | 2/2002 | Rizzo et al. |
| 6,358,756 | B1 | | 3/2002 | Sandhu et al. |
| 6,359,805 | B1 | | 3/2002 | Hidaka |
| 6,363,007 | B1 | | 3/2002 | Lu et al. |
| 6,366,494 | B2 | | 4/2002 | Weber et al. |
| 6,379,978 | B2 | | 4/2002 | Goebel et al. |
| 6,383,574 | B1 | | 5/2002 | Han et al. |
| 6,385,109 | B1 | | 5/2002 | Naji |
| 6,388,917 | B2 | | 5/2002 | Hoffmann |
| 6,389,524 | B1 | | 5/2002 | Sato |
| 6,392,922 | B1 | | 5/2002 | Liu et al. |
| 6,392,923 | B1 | | 5/2002 | Naji |
| 6,392,924 | B1 | | 5/2002 | Liu et al. |
| 6,396,735 | B2 | | 5/2002 | Michijima et al. |
| 6,404,674 | B1 | | 6/2002 | Anthony et al. |
| 6,418,046 | B1 | | 7/2002 | Naji |
| 6,424,562 | B1 | | 7/2002 | Rosner et al. |
| 6,429,497 | B1 | | 8/2002 | Nickel |
| 6,430,084 | B1 | | 8/2002 | Rizzo et al. |
| 6,436,526 | B1 | | 8/2002 | Odagawa et al. |
| 6,445,612 | B1 | | 9/2002 | Naji |
| 6,449,133 | B1 | | 9/2002 | Makino et al. |
| 6,466,471 | B1 | | 10/2002 | Bhattacharyya |
| 6,469,878 | B1 | | 10/2002 | Mack et al. |
| 6,473,335 | B2 | | 10/2002 | Bohm et al. |
| 6,475,812 | B2 | | 11/2002 | Nickel et al. |
| 6,487,110 | B2 | | 11/2002 | Nishimura et al. |
| 6,493,259 | B1 | | 12/2002 | Swanson et al. |
| 6,501,144 | B1 | | 12/2002 | Rizzo |
| 6,515,895 | B2 | | 2/2003 | Naji |
| 6,531,723 | B1 | | 3/2003 | Engel et al. |
| 6,538,919 | B1 | | 3/2003 | Abraham et al. |
| 6,545,906 | B1 | * | 4/2003 | Savtchenko et al. ........ 365/158 |
| 6,556,473 | B2 | | 4/2003 | Saito et al. |
| 6,567,246 | B1 | | 5/2003 | Sakakima et al. |
| 6,633,498 | B1 | | 10/2003 | Engel et al. |
| 6,674,662 | B1 | | 1/2004 | Hillebrands et al. |
| 6,707,083 | B1 | | 3/2004 | Hiner et al. |
| 6,714,444 | B2 | * | 3/2004 | Huai et al. .................. 365/171 |
| 6,714,448 | B2 | | 3/2004 | Engel |
| 6,724,586 | B2 | * | 4/2004 | Gill ......................... 360/324.2 |
| 6,756,237 | B2 | * | 6/2004 | Xiao et al. ..................... 438/3 |
| 2001/0026470 | A1 | | 10/2001 | Gilles et al. |
| 2001/0035545 | A1 | | 11/2001 | Schuster-Woldan et al. |
| 2001/0050859 | A1 | | 12/2001 | Siegfried |
| 2002/0024780 | A1 | | 2/2002 | Mao et al. |
| 2002/0036331 | A1 | | 3/2002 | Nickel et al. |
| 2002/0036919 | A1 | | 3/2002 | Daughton et al. |
| 2002/0039308 | A1 | | 4/2002 | Gogl et al. |
| 2002/0044396 | A1 | | 4/2002 | Amano et al. |
| 2002/0048185 | A1 | | 4/2002 | Thewes et al. |
| 2002/0058158 | A1 | | 5/2002 | Odagawa et al. |
| 2002/0080644 | A1 | | 6/2002 | Ito |
| 2002/0080661 | A1 | | 6/2002 | Gogl et al. |
| 2002/0089024 | A1 | | 7/2002 | Iwata |
| 2002/0097540 | A1 | | 7/2002 | Hayashi et al. |
| 2002/0097602 | A1 | | 7/2002 | Lammers |
| 2002/0154539 | A1 | | 10/2002 | Swanson et al. |
| 2002/0159203 | A1 | | 10/2002 | Saito et al. |
| 2003/0042562 | A1 | | 3/2003 | Glebler et al. |
| 2003/0072174 | A1 | | 4/2003 | Savtchenko et al. |
| 2003/0089933 | A1 | | 5/2003 | Janesky et al. |
| 2004/0120184 | A1 | | 6/2004 | Janesky et al. |

FOREIGN PATENT DOCUMENTS

| | | |
|---|---|---|
| EP | 0 279 537 | 12/1993 |
| EP | 0 613 148 | 1/1994 |
| EP | 0 335 715 | 7/1995 |
| EP | 0 773 551 | 5/1997 |
| EP | 0 936 624 | 8/1999 |
| EP | 0 962 939 | 8/1999 |
| EP | 0 971 424 | 1/2000 |
| EP | 0 992 984 | 4/2000 |
| EP | 1 061 592 | 12/2000 |
| EP | 0 768 672 | 4/2001 |
| EP | 1 094 468 | 4/2001 |
| EP | 1 109 068 | 6/2001 |
| EP | 1 109 170 | 6/2001 |
| EP | 0 624 868 | 8/2001 |
| EP | 1 126 531 | 8/2001 |
| EP | 1 168 355 | 1/2002 |
| EP | 1 298 669 | 4/2003 |
| EP | 0 929 110 | 12/2003 |
| GB | 1 052 646 | 3/1965 |
| JP | 01 214077 | 2/1988 |
| JP | 02 288209 | 4/1989 |

| | | |
|---|---|---|
| JP | 06 061293 | 3/1994 |
| JP | 09 050611 | 12/1995 |
| JP | 09 199769 | 1/1996 |
| JP | 08 096328 | 4/1996 |
| JP | 08 321739 | 12/1996 |
| JP | 09 306159 | 11/1997 |
| JP | 09 306733 | 11/1997 |
| JP | 09 325746 | 12/1997 |
| JP | 10 004226 | 1/1998 |
| JP | 10 162326 | 6/1998 |
| JP | 10 162568 | 6/1998 |
| JP | 10 270776 | 10/1998 |
| JP | 11 039858 | 2/1999 |
| JP | 11 316913 | 11/1999 |
| JP | 2000 090418 | 3/2000 |
| JP | 2000 123225 | 4/2000 |
| JP | 2000 132961 | 5/2000 |
| JP | 2000 286478 | 10/2000 |
| JP | 2001 068760 | 3/2001 |
| JP | 2001 084756 | 3/2001 |
| JP | 2002 141481 | 5/2002 |
| JP | 2002 170374 | 6/2002 |
| JP | 2002 334585 | 11/2002 |
| WO | WO 93/09541 | 5/1993 |
| WO | WO 98/47613 | 10/1996 |
| WO | WO 96/41379 | 12/1996 |
| WO | WO 99/18578 | 9/1998 |
| WO | WO 00/04551 | 1/2000 |
| WO | WO 00/058970 | 10/2000 |
| WO | WO 02/41367 | 5/2002 |
| WO | WO 02/073620 | 9/2002 |

OTHER PUBLICATIONS

Pohm et al., "Demagnetization Effects on Forward and Reverse Thresholds of M–R Memory Elements," Journal of Applied Physics, Bd. 69, Nr. 8, 5763–5764.

Pohm et al., The Energy and Width of Paired Neel Walls in Double Layer M–R Films, IEEE Transactions on Magnetics, Bd. 26, Nr. 5, Sep. 1990, 2831–2833.

Pohm et al., "Experimental and Analytical Properties of 0.2 Micron Wide, Multilayer, GMR, Memory Elements," IEEE Transactions on Magnetics, Bd. 32, Nr. 5, Sep. 1996, 4645–1647.

Pohm et al., "Future Projections and Capabilities of GMR NV Memory," IEEE International Nonvolatile Memory Technology Conference, 24–26, Jun. 1996, 113–115.

Tehrani et al., "High Density Nonvolatile Magnetoresistive RAM," International Electron Devices Meeting, Dec. 1996, 193–196.

Comstock et al., "Perturbations to the Stoner–Wohlfarth Threshold in 2 × 20 $\mu$ M–R Memory Elements," Journal of Applied Physics, Bd. 63, Nr. 8, Apr. 15, 1988, 4321–4323.

Beech et al., "Simulation of Sub–Micron GMB Memory Cells," IEEE Transactions on Magnetics, BD. 31, Nr. 6, Nov. 1995, 3200–3202.

Tang et al., "Spin–Valve Ram Cell," IEEE Transactions on Magnetics, Bd. 31, Nr. 6, Nov. 1995, 3206–3208.

Yoo et al., "2–Dimensional Numerical Analysis of Laminated Thin Film Elements," IEEE Transactions on Magnetics, Bd. 24, Nr. 6, Nov. 1988, 2377–2379.

Uhm et al., "Computer Simulation of Switching Characteristics in Magnetic Tunnel Junctions Exchange–Biased by Synthetic Antiferromagnets," Journal of Magnetism and Magnetic Materials, vol. 239, Issues 1–3, Feb. 2002, pp. 123–125.

Worledge et al., "Spin Flop Switching for Magnetic Random Access Memory,"Applied Physics Letters, Vo. 84, No. 22, May 31, 2004, pp. 4559–4561.

Worledge et al., "Magnetic Phase Diagram of Two Identical Coupled Nanomagnets,".

Engel et al., "A 4–Bit Toggle MRAM Based on a Novel Bit and Switching Method," IEEE Transactions on Magnetism, 2004, pp. 1–5.

* cited by examiner

MRAM ELEMENT AND METHODS FOR WRITING THE MRAM ELEMENT

FIELD OF THE INVENTION

The present invention generally relates to magnetoelectronics information devices, and more particularly relates to a Magnetoresistance Random Access Memory (MRAM) element and methods for writing the MRAM element.

BACKGROUND OF THE INVENTION

Magnetoelectronics, spin electronics and spintronics are synonymous terms for the use of effects predominantly caused by electron spin. Magnetoelectronics is used in numerous information devices, and provides non-volatile, reliable, radiation resistant, and high-density data storage and retrieval. The numerous magnetoelectronics information devices include, but are not limited to, Magnetoresistive Random Access Memory (MRAM), magnetic sensors and read/write heads for disk drives.

Typically, a magnetoelectronics information device, such as an MRAM memory element, has a structure that includes multiple magnetic layers separated by various non-magnetic layers. Information is stored as directions of magnetization vectors in the magnetic layers, which are also referred to herein as magnetization states. Magnetic vectors in one magnetic layer are generally magnetically fixed or pinned, while the magnetization direction of the other magnetic layer is free to switch between the same and opposite directions that are called "parallel" and "antiparallel" magnetization states, respectively. In response to parallel and antiparallel magnetization states, the magnetic memory element exhibits different resistances. Therefore, a detection of change in the measured resistance allows a magnetoelectronics information device, such as an MRAM device, to provide information stored in the magnetic memory element.

Accordingly, it is desirable to provide a magnetoelectronics information device that is configured to provide multiple magnetization states. In addition, it is desirable to provide methods of providing one or more magnetization states of a magnetoelectronics information device, which is also referred to herein as writing a magnetoelectronics information device. Furthermore, other desirable features and characteristics of the present invention will become apparent from the subsequent description and the appended claims, taken in conjunction with the accompanying drawings.

BRIEF SUMMARY OF THE INVENTION

A magnetoelectronics information device is provided in accordance with the present invention. The magnetoelectronics information device includes a free magnetic region, a pinned magnetic region and a tunneling barrier interposed between the free magnetic region and the pinned magnetic region. The magnetic moments of the free magnetic region and the pinned magnetic region that are adjacent to the tunneling barrier are oriented to provide a first magnetization state when: a first magnetic field with a first field magnitude is produced in proximity to the magnetoelectronics information device at a first time, a second magnetic field with a second field magnitude is produced in proximity to the magnetoelectronics information device at a second time, the first magnetic field is adjusted to provide a third field magnitude that is less than the first field magnitude and greater than zero at a third time, and the second magnetic field is adjusted to provide a fourth field magnitude that is less than the second field magnitude at a fourth time (t4).

A method is also provided for writing a magnetoelectronics information device having a free magnetic region, a pinned magnetic region and a tunneling barrier interposed between the free magnetic region and the pinned magnetic region. The method for writing the magnetoelectronics information device comprising the steps producing a first magnetic field with a first field magnitude in proximity to the magnetoelectronics information device at a first time, producing a second magnetic field with a second field magnitude in produced in proximity to the magnetoelectronics information device at a second time, adjusting the first magnetic field to provide a third field magnitude at a third time that is less than the first field magnitude and greater than zero, and adjusting the second magnetic field to provide a fourth field magnitude at a fourth time that is less than the second magnitude.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any expressed or implied theory presented in the preceding background of the invention or the following detailed description of the invention.

Figure 1:
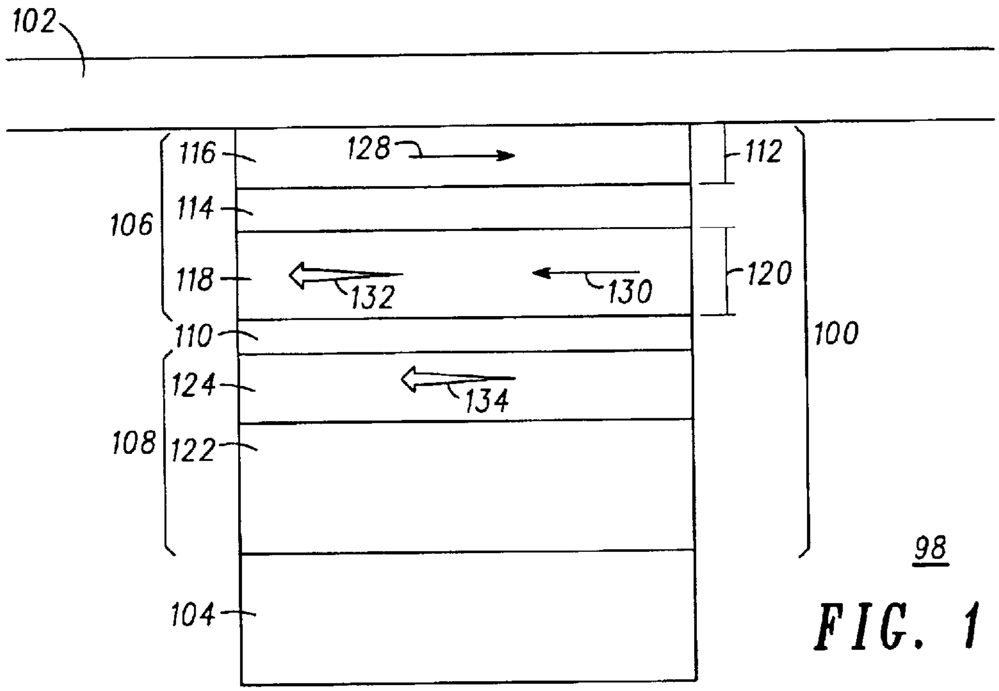
FIG. 1 is a simplified sectional view of an MRAM element according to a first exemplary embodiment of the present invention.

Referring to FIG. 1, a magnetoelectronics information device, which is configured as an MRAM element 98, is shown in accordance with an exemplary embodiment of the present invention. The MRAM element 98 can be any number of MRAM elements such as the MRAM element as originally described in U.S. Pat. No. 6,545,906, titled "A Method of Writing to a Scalable Magnetoresistance Random Access Memory Element," filed Oct. 16, 2001, naming Leonid Savtchenko as an inventor, which is hereby incorporated in its entirety by reference and shall be referred to hereinafter as the Savtchenko Reference. However, other MRAM elements and magnetoelectronics information devices are available in accordance with the present invention (e.g., magnetic sensors and read/write heads). Furthermore, while a single MRAM element 98 is illustrated and described in this detailed description, multiple MRAM elements are typically used to form an MRAM, and multiple magnetoelectronics information devices are generally used to form a magnetic sensor and read/write heads, or other devices.

Generally, the MRAM element 98 includes a Magnetic Tunnel Junction (MTJ) 100 interposed between two write lines (102,104). The MTJ 100 has two magnetic regions (106,108) and a tunneling barrier region 110 interposed between the two magnetic regions (106,108). The two magnetic regions (106,108) are multi-layer structures and the tunnel barrier region 110 is illustrated as a single layer structure even though a multi-layer structure can be used in accordance with the present invention.

The multi-layer structure of one magnetic region 106 is a tri-layer structure that has a non-magnetic layer 114 interposed between two ferromagnetic layers (116,118). The other magnetic region 108 is a dual-layer structure having an anti-ferromagnetic layer 122 and a ferromagnetic layer 124, and the tunnel barrier region 110 is a single layer structure formed of one or more non-conductive materials. However, the magnetic regions (106,108) and the tunnel barrier region 110 can have additional layers to form other multi-layer structures than the tri-layer structure, dual-layer structure, and single layer structure. For example, the magnetic regions (106,108) and/or the tunnel barrier region 110 can have one or more additional anti-ferromagnetic layers, ferromagnetic layers, substrate layers, seed layers, non-conductive layers and/or template layers.

The non-magnetic layer 114 can be formed of any number of suitable non-magnetic or anti-ferromagnetic materials such as ruthenium (Ru), osmium (Os), rhenium (Re), chromium (Cr), rhodium (Rh), or copper (Cu), or combinations thereof, and the anti-ferromagnetic layer 122 can be formed with any number of suitable anti-ferromagnetic materials such as manganese alloys (e.g., iridium manganese (IrMn), iron manganese (FeMn), rhodium manganese (RhMn), platinum manganese (PtMn), and platinum palladium manganese (PtPdMn)). The ferromagnetic layers (116,118,124) can be formed of any number of suitable ferromagnetic materials such as nickel (Ni), iron (Fe), or cobalt (Co), or combinations thereof (e.g., nickel iron (NiFe), cobalt iron (CoFe) and nickel iron cobalt (NiFeCo)) and the tunnel barrier region 110 can be formed of one or more non-conductive materials. For example, the tunnel barrier region 110 can be formed of aluminum oxide ($Al_2O_3$), hafnium oxide ($HfO_2$), Boron oxide ($B_2O_3$), tantalum oxide ($Ta_2O_5$), zinc oxide ($ZnO_2$) and other oxides, nitrides, or other suitable dielectrics. However, other materials or combination of materials can be used in these layers in accordance with the present invention.

The formation of the non-magnetic 114 interposed between the two ferromagnetic layers (116,118) provides a free magnetic region 106, which as used herein shall mean a magnetic region with a resultant magnetic moment 132 that is free to rotate in the presence of an applied magnetic field. In addition, the formation of the anti-ferromagnetic layer 122 and the ferromagnetic layer 124 forms a pinned magnetic region 108, which as used herein shall mean a magnetic region with a resultant magnetic moment 134 that does not typically rotate in the presence of the applied magnetic field that rotates the resultant magnetic moment 132 of the free magnetic region 106. The resultant magnetic moment 134 of the pinned magnetic region 108 is substantially pinned in a predefined direction, which can be any number of directions in accordance with the present invention, and the resultant magnetic moment 132 of the free magnetic region 106 is the result of the magnetic moments (128,130) of the ferromagnetic layers (116,118), which are both preferably free to rotate.

The free magnetic moments (128,130) of the free magnetic region 106 are preferably non-parallel with respect to each other and more preferably at least substantially anti-parallel. The magnetic moments (128,130) of the ferromagnetic layers (116,118) are preferably unbalanced, which as used herein shall mean that the fractional balance ratio ($M_{br}$) as set forth in equation (1) is in the range of about five hundredths (0.05) to about one tenth (0.1) (i.e., $0.05 \leqq M_{br} \leqq 0.1$).

$$M_{br}=\Delta M/M_{total}=(|M_2|-M_1|)/(|M_1|+M_2|) \quad (1)$$

Where $|M_1|$ is the magnitude of one magnetic moment (e.g., magnetic moment 128) of the free magnetic region 106 and $|M_2|$ is the magnitude of the other magnetic moment (e.g., 130) of the free magnetic region 106. The magnitudes of the magnetic moments (128,130) of the free magnetic region 106 can be selected using any number of techniques know to those of ordinary skill in the art. For example, the thicknesses (112,120) of the ferromagnetic layers (116,118) can be adjusted to provide moments with magnitudes that provide the slight imbalance or different ferromagnetic materials can be used in the formation of the free magnetic region.

The magnetic moments (128,130) of the free magnetic region 106 are preferably coupled with the non-magnetic layer 114. While the non-magnetic layer 114 anti-ferromagnetically couples the magnetic moments (128,130) of the ferromagnetic layers (116,118), it will be understood that the anti-ferromagnetic coupling can be provided with other mechanisms. For example, the mechanism for anti-ferromagnetically coupling can be magnetostatic fields.

The relative orientation of the resultant magnetic moment 134 of the pinned magnetic region 108 and the resultant magnetic moment 132 of the free magnetic region 106, which are effectively the magnetic moments of the ferromagnetic layer 124 and the ferromagnetic layer 118 adjacent to the tunnel barrier region 110, respectively, affects the resistance of the MTJ 100. Therefore, as the resultant magnetic moment 132 of the free magnetic region 106 rotates and the resultant magnetic moment 134 of the pinned magnetic region 108 remains substantially constant, the resistance of the MTJ 100 changes and the varying resistance values can be assigned any number of values.

The values of the MTJ 100 are binary values (e.g., 0 or 1) in accordance with an exemplary embodiment of the present invention. One of the binary values corresponds to a substantially parallel orientation between the resultant moment 132 of the free magnetic region 106 and the resultant magnetic moment 134 of the pinned magnetic region 108 (i.e., one of two magnetization states). The other binary value corresponds to a substantially anti-parallel orientation between the resultant moment 132 of the free magnetic region 106 and the resultant magnetic moment 134 of the pinned magnetic region 108 (i.e., the other magnetization state of the two magnetization states). The resistance of the MTJ 100 with the substantially anti-parallel orientation provides a first resistive value and the resistance of the MTJ 100 with the substantially parallel orientation provides a second resistive value. Therefore, the binary value can be determined by measuring the resistance of the MTJ 100 (i.e., reading the MTJ), and repositioning the resultant magnetic moment 132 of the free magnetic region 106 changes the binary value stored by the MTJ 100 (i.e., writing the MTJ).

Figure 2:
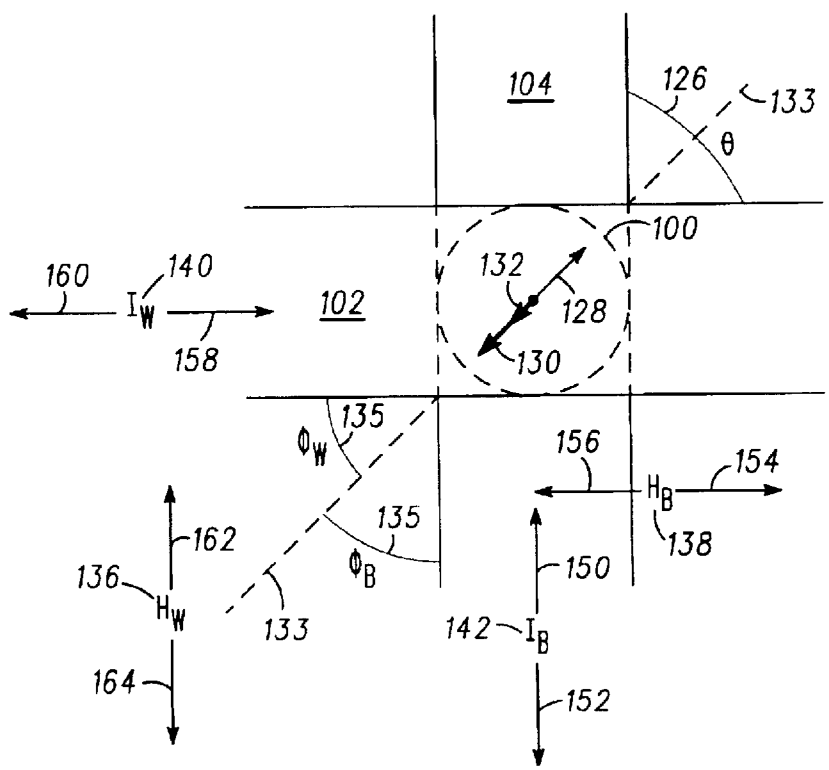
FIG. 2 is a simplified plan view of the MRAM element of FIG. 1 according to an exemplary embodiment of the present invention.

Referring to FIG. 2, the resultant magnetic moment 132 of the free magnetic region 106 is preferably oriented along an anisotropy easy-axis 133 in a direction that is at an angle ($\Phi_W$ or $\Phi_B$) 135 with respect to at least one of the two lines (102,104), which shall be referred to herein as the word line 102 and the bit line 104 for clarity and convenience. More preferably, the resultant magnetic moment 132 is oriented along an anisotropy easy-axis 133 in a direction that is at about a forty-five degree (45°) angle with respect to the word line 102 (i.e., $\Phi_W \approx 45°$) or the bit line 104 (i.e., $\Phi_B \approx 45°$) and preferably at such an angle with the word line 102 and the bit line 104 (i.e., $\Phi_W \approx 45°$ and $\Phi_B \approx = 45°$). However, other orientations of the resultant magnetic moment 132 with respect to the word line 102 and/or the bit line 104 can be used in accordance with the present invention.

In addition to the preferred orientation of the resultant magnetic moment 132 with respect to the word line 102 and/or the bit line 103, the word line 102 is preferable oriented at an angle (θ) 126 with respect to the bit line 104. Preferably, the angle (θ) 126 is about ninety degrees (90°) or ninety degrees (90°). However, other angles can be used in accordance with the present invention.

The orientation of the word line 102 and the bit line 104 and the proximity of these lines (102,104) to the MTJ 100 provides a configuration in which two magnetic fields (136, 138) produced by the two lines (102,104) can alter the direction of the magnetic moments (128,130) of the ferromagnetic layers (116,118) and therefore alter the orientation of the resultant magnetic moment 132 to change the binary value stored by the MTJ 100 (i.e., writing the MTJ). One magnetic field 136 is preferably produced with the introduction of an electrical current 140 in the word line 102 and the other magnetic field 138 is preferably produced with the introduction of an electrical current 142 in the bit line 104. Therefore, the magnetic field 136 produced by the electrical current ($I_W$) 140 in the word line 102 shall be referred to as the word magnetic field ($H_W$) and the magnetic field 138 produced by the electrical current 142 in the bit line 104 shall be referred to as the bit magnetic field ($H_B$) for convenience.

Figure 3:
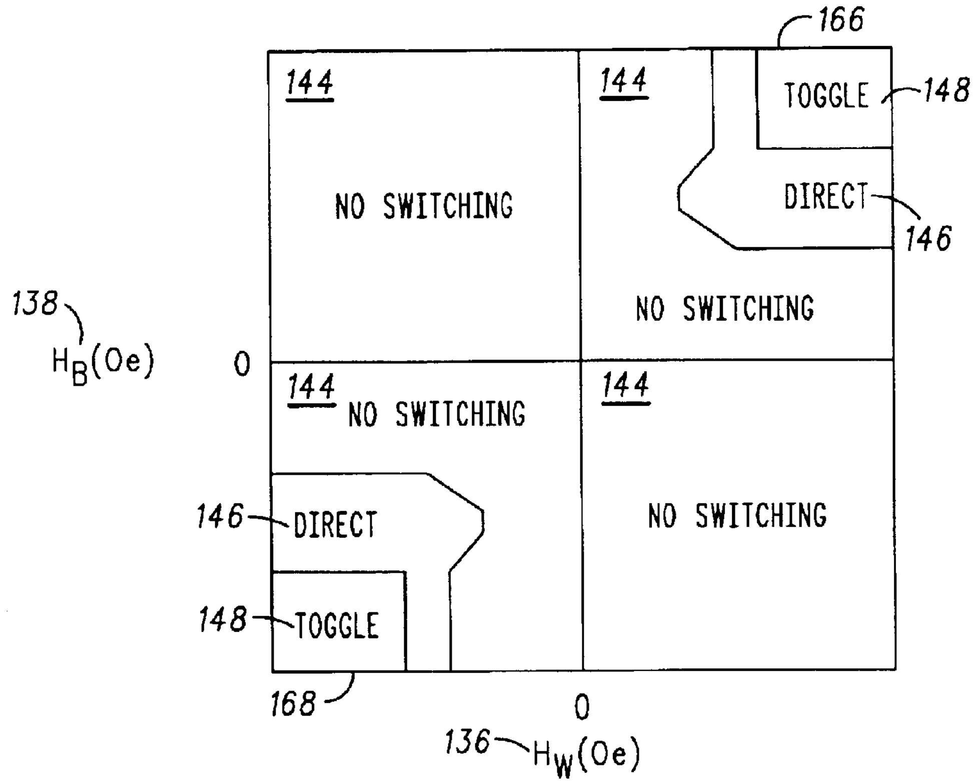
FIG. 3 is a graph illustrating magnetic field combinations that produce a direct write and a toggle write in the MRAM element of FIG. 1 according to an exemplary embodiment of the present invention.

Referring to FIG. 3, a graph is presented that illustrates the writing regions for the MTJ 98 shown in FIG. 1 and FIG. 2 in relation to the application of the word magnetic field ($H_W$) 136 and the bit magnetic field ($H_B$) 138 as shown in FIG. 2. There are two writing regions, which are the direct write regions 146 and the toggle write regions 148, and a no switching region 144. The combination of magnetic fields (136,138) associated with the no switching regions 144 do not affect a write as the combination of magnetic fields associated with the no switching regions do not alter the respective orientation of the resultant magnetic moments. However, the combination of magnetic fields (136,138) in the direct write regions 146 and toggle write regions 148 have the potential of altering the respective orientation of the resultant magnetic moments.

The combination of magnetic fields (136,138) associated with the toggle write regions 148, which will be referred herein as a toggle write, results in a reorientation of the resultant magnetic moments irrespective of the existing moment orientation of the MTJ. For example, if the resultant magnetic moments of the free magnetic region and the pinned magnetic region are at least substantially parallel and a toggle write is conducted, the resultant magnetic moments are changed to the at least substantially anti-parallel orientation after the toggle write. Conversely, if the resultant magnetic moments are at least substantially anti-parallel and a toggle write is conducted, the resultant magnetic moments are altered to the at least substantially parallel orientation after the toggle write. Therefore, the toggle write changes the binary value to the other binary value regardless of the binary value stored at the time the toggle write commences.

In contrast to the toggle write, the combination of magnetic fields (136,138) associated with the direct write regions 146, which will be referred to herein as a direct write, results in a reorientation of the resultant magnetic moments only if the desired orientation of the resultant magnetic moments that is sought by the direct write is different than the existing orientation of the resultant magnetic moments prior to the direct write. For example, if the resultant magnetic moments are at least substantially parallel and a direct write is conducted to request an at least substantially parallel orientation between the resultant magnetic moments, the resultant magnetic moments remain in the at least substantially parallel orientation. However, if the resultant magnetic moments are at least substantially parallel and a direct write is conducted to request an at least substantially anti-parallel orientation between the resultant magnetic moments, the resultant magnetic moments are oriented into the at least substantially anti-parallel orientation. Conversely, if the resultant magnetic moments are at least substantially anti-parallel and a direct write is conducted to request an at least substantially anti-parallel orientation between the resultant magnetic moments, the resultant magnetic moments remain in the at least substantially anti-parallel orientation, and if the resultant magnetic moments are at least substantially anti-parallel and a direct write is conducted to request an at least substantially parallel orientation between the resultant magnetic moments, the resultant magnetic moments are oriented into the at least substantially parallel orientation.

The requested orientation in a direct write is determined by the polarity of the magnetic fields. For example, if a parallel orientation between the resultant magnetic moments is sought, two positive magnetic fields are applied to the free magnetic region and if an anti-parallel orientation between the resultant magnetic moments is sought, both magnetic fields are negative. However, the MTJ 100 can be configured for direct write configurations with other polarities.

Referring to FIG. 2, the polarities of the magnetic fields (136,138) and the magnitudes of the magnetic fields (136, 138) for the direct write and toggle write are produced in this exemplary embodiment with the introduction and adjustment of electrical currents (140,142) in the word line 102 and the bit line 104 with the corresponding polarities and magnitudes. As can be appreciated by those of ordinary skill in the art, introduction of an electrical current in a line produces a corresponding magnetic field about the line. Therefore, introduction of an electrical current 140 in the word line 102 and introduction of an electrical current 142 in the bit line 104 will produce the word magnetic field 136 and a bit magnetic field 138, respectively. Furthermore, a positive current 150 and a negative current 152 in the bit line 104, which are arbitrarily defined for illustrative purposes, produces a positive bit magnetic field 154 and a negative bit magnetic field 156, respectively. In addition, a positive current 158 in the word line 102 and a negative current 160 in the word line 102, which are arbitrarily defined for illustrative purposes, produces a positive word magnetic field 162 and a negative word magnetic field 164, respectively. Furthermore, an increase in the magnitude of the electrical current 140 in the word line 104 and an increase in the magnitude of the electrical current 142 in the bit line 102 results in an increase in the magnitude of the word magnetic field 136 and bit magnetic field 138, respectively. Moreover, a decrease in the magnitude of the electrical current 140 in the word line 104 and a decrease in the magnitude of the electrical current 142 in the bit line 102 results in a decrease in the magnitude of the word magnetic field 136 and bit magnetic field 138, respectively.

The increases and/or decreases in the magnitudes of the word magnetic field 136 and the bit magnetic field 138 are controlled to provide combinations of direct writes or a combination of a direct write and a toggle write in order to write the desired binary value without a reading action. Examples of these combinations are set forth in equation (2), equation (3), equation (4) and equation (5), with the polarities for the magnetic fields associated with the first quadrant (Q1) and third quadrant (Q3) of FIG. 3:

$$\text{First Binary Value}=DW(Q1) \text{ and Second Binary Value}=DW(Q1)+TW(Q1) \quad (2)$$

$$\text{First Binary Value}=DW(Q3) \text{ and Second Binary Value}=DW(Q3)+TW(Q3) \quad (3)$$

$$\text{First Binary Value}=DW(Q1) \text{ and Second Binary Value}=DW(Q3) \quad (4)$$

$$\text{First Binary Value}=DW(Q3) \text{ and Second Binary Value}=DW(Q1) \quad (5)$$

Figure 4:
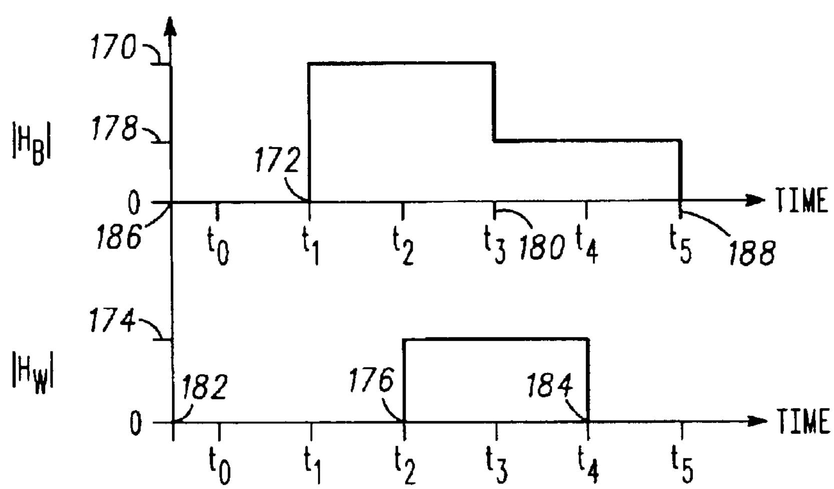
FIG. 4 is a graph illustrating a timing diagram of magnetic fields for a direct write in the MRAM element of FIG. 1 according to an exemplary embodiment of the present invention.
Figure 5:
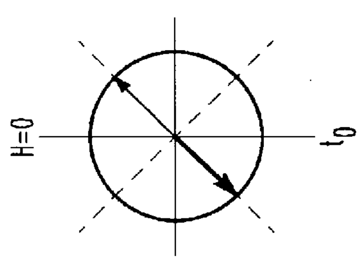
FIGS. 5–10 are illustrations of the movement of the magnetic moments during the direct write of FIG. 4 that results in a change in the value of the MRAM element.
Figure 6:
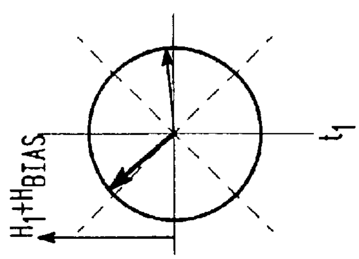
Figure 7:
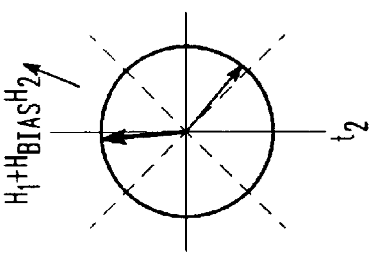
Figure 8:
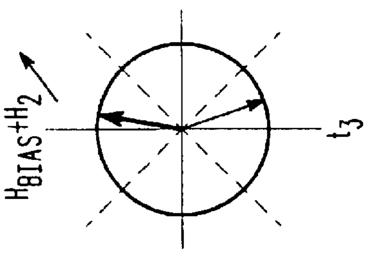
Figure 9:
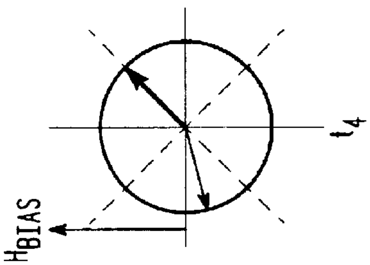
Figure 10:
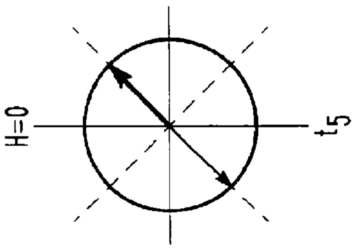
Figure 11:
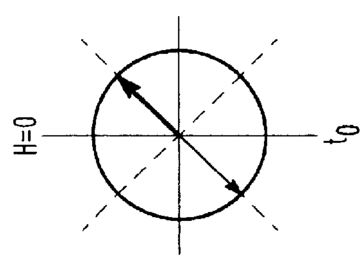
FIGS. 11–16 are illustrations of the movement of the magnetic moments during the direct write of FIG. 4 that does not result in a change in the value of the MRAM element.
Figure 12:
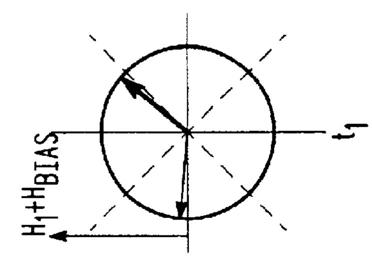
Figure 13:
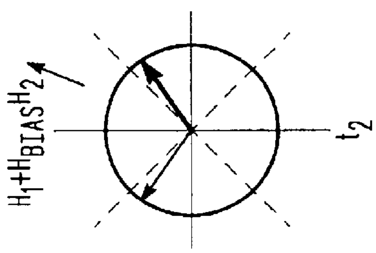
Figure 14:
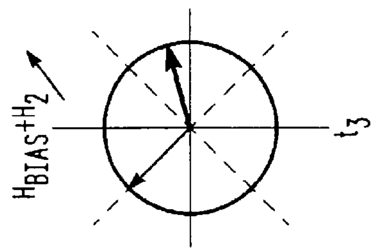
Figure 15:
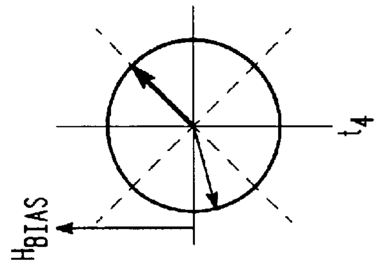
Figure 16:
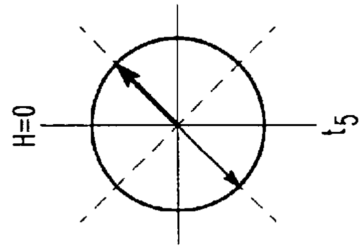

Referring to FIG. 4, a sequence is illustrated for generating magnetic fields with the application of currents to perform the direct write (DW) in equation (2), equation (3), equation (4), and equation (5) in accordance with an exemplary embodiment of the present invention. A bit magnetic field having a first bit magnitude ($|H_{B1}|$) 170 is produced at a first time ($t_1$) 172 with the introduction of an electrical current in the bit line and a word magnetic field having a first word magnitude ($|H_{W1}|$) 174 is produced at a second time ($t_2$) 176 with an introduction of an electrical current in the word line. After the word magnetic field having the first word magnitude ($|H_{W1}|$) 174 is produced at the second time ($t_2$) 176, the current in the bit line current is adjusted to reduce the bit magnetic field to a second bit magnitude ($|H_{B2}|$) 178 at a third time ($t_3$) 180. The second bit magnitude ($|H_{B2}|$) 178 is preferably less than the first bit magnitude ($|H_{B1}|$) 170 and greater than zero. More preferably the second bit magnitude ($|H_{B2}|$) 178 is preferably less than about seventy-five percent (75%) of the first bit magnitude ($|H_{B1}|$) 170 and greater than about twenty five percent of the (25%) of the first bit magnitude ($|H_{B1}|$) 170, and more preferably about fifty percent (50%) of the first bit magnitude ($|H_{B1}|$) 170.

Once the bit magnetic field is reduced to the second bit magnitude ($|H_{B2}|$) 178, the current in the word line is adjusted to reduce the word magnetic field to a second word magnitude ($|H_{W2}|$) 182 at a fourth time ($t_4$) 184. The second word magnitude ($|H_{W2}|$) 182 is preferably less than about fifty percent (50%) of the first word magnitude ($|H_{W1}|$) 174, more preferably less than about twenty-five percent (25%) of the first word magnitude ($|H_{W1}|$) 174, and even more preferably less than about five percent (5%) of the first word magnitude ($|H_{W1}|$) 174. Subsequent to this reduction in the magnitude of the word magnetic field to the second word magnitude ($|H_{W2}|$) 182, the bit magnetic field is further reduced to a third bit magnitude ($|H_{B3}|$) 186 with a reduction in the current in the bit line at a fifth time ($t_5$) 188. The third bit magnitude ($|H_{B3}|$) 186 is preferably less than about fifty percent (50%) of the second bit magnitude ($|H_{B2}|$) 178, more preferably less than about twenty-five percent (25%) of the second bit magnitude ($|H_{B2}|$) 178, even more preferably less than about five percent (5%) of the second bit magnitude ($|H_{B2}|$) 174, and this reduction completes the direct write sequence.

Once the direct write sequence is completed, the magnetic moments (128,130) and therefore the resultant magnetic moment 132 of the free magnetic layer is rotated in a manner as shown in FIGS. 5–10 if the desired moment orientation that is sought by the direct write is different than the existing orienation of the resultant magnetic moment prior to the direct write. Alternatively, the magnetic moments (128,130) and therefore the resultant magnetic moment 132 of the free magnetic layer is rotated in a manner as shown in FIGS. 11–16 if the desired moment orientation that is sought by the direct write is the same as the existing orientation of the resultant magnetic moment prior to the direct write. Therefore, regardless of the initial orientation of the resultant magnetic moment, a known orientation of the resultant magnetic moment is produced with the direct write sequence previously described with reference to FIG. 4. Accordingly, the first binary value is produced with the direct write and a toggle write can be conducted to switch the first binary value to the second binary value as the toggle write results in the reorientation of the resultant magnetic moment irrespective of the existing moment orientation as previously discussed in this detailed description of the invention.

Figure 17:
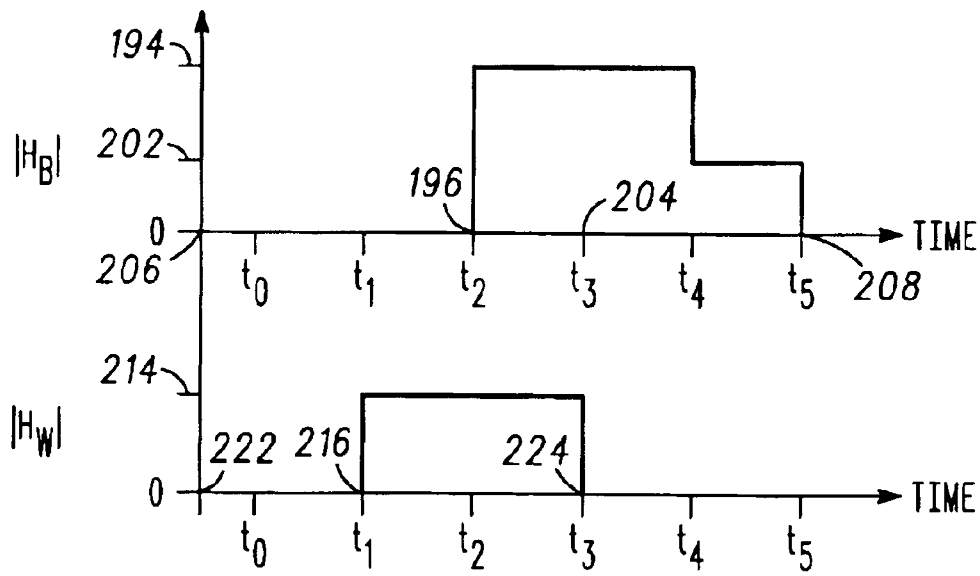
FIG. 17 is a graph illustrating a timing diagram of magnetic fields for a first toggle write in the MRAM element of FIG. 1 according to an exemplary embodiment of the present invention.

Referring to FIG. 17, a first sequence is illustrated for generating magnetic fields with the application of currents to perform the toggle write (TW) in equation (2) and equation (3) which is conducted after the direct write sequence is conducted as previously described with reference to FIG. 4. A word magnetic field having a first word magnitude ($|H_{W1}|$) 190 is produced at a first time ($t_1$) 192 with the introduction of a current in the word line and a bit magnetic field having a first bit magnitude ($|H_{B1}|$) 194 is produced at a second time ($t_2$) 196. After the bit magnetic field having the first bit magnitude ($|H_{B1}|$) 194 is produced at the second time ($t_2$) 196, the current in the word line is adjusted to reduce the word magnetic field to a second word magnitude ($|H_{W2}|$) 198 at a third time ($t_3$) 200. The second word magnitude ($|H_{W2}|$) 198 is preferably less than about fifty percent (50%) of the first word magnitude ($|H_{W1}|$) 190, more preferably less than about twenty-five percent (25%) of the first word magnitude ($|H_{W1}|$) 190, and even more preferably less than about five percent (5%) of the first word magnitude ($|H_{W1}|$) 190.

Once the word magnetic field is reduced to the second word magnitude ($|H_{W2}|$) 198, the current in the bit line is adjusted to reduce the bit magnetic field to a second bit magnitude ($|H_{B2}|$) 202 at a fourth time ($t_4$) 204. The second bit magnitude ($|H_{B2}|$) 202 is preferably less than the first bit magnitude ($|H_{B1}|$) 194 and greater than zero. More preferably the second bit magnitude ($|H_{B2}|$) 202 is preferably less than about seventy-five percent (75%) of the first bit magnitude ($|H_{B1}|$) 194 and greater than about twenty five percent of the (25%) of the first bit magnitude, and more preferably about fifty percent (50%) of the first bit magnitude ($|H_{B1}|$) 194. Subsequent to this reduction in the magnitude of the bit magnetic field to the second bit magnitude ($|H_{B2}|$) 202, the bit magnetic field is further reduced to a third bit magnitude ($|H_{B3}|$) 206 with a reduction in the current in the bit line at a fifth time ($t_5$) 208. The third bit magnitude ($|H_{B3}|$) 206 is preferably less than about fifty percent (50%) of the second bit magnitude ($|H_{B2}|$) 202, more preferably less than about twenty-five percent (25%) of the second bit magnitude ($|H_{B2}|$) 202, even more preferably less than about five percent (5%) of the second bit magnitude ($|H_{B2}|$) 202, and this reduction completes the toggle sequence, which rotates the free magnetic layer in a manner as shown in FIGS. 18-23 or FIGS. 24-29 to provide the second binary value.

Figure 30:
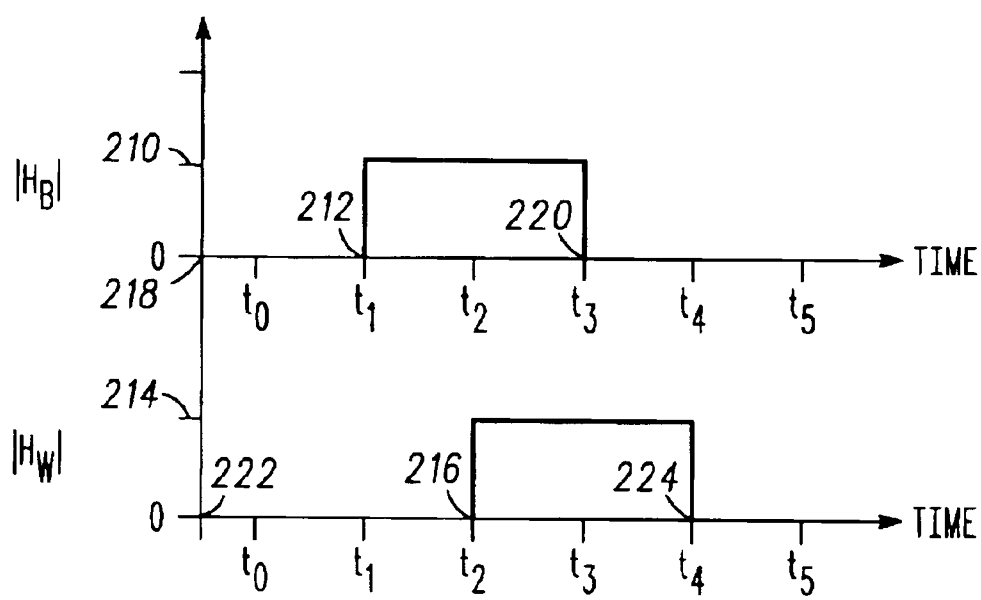
FIG. 30 is a graph illustrating a timing diagram of magnetic fields for a second toggle write in the MRAM element of FIG. 1 according to an exemplary embodiment of the present invention.
Figure 18:
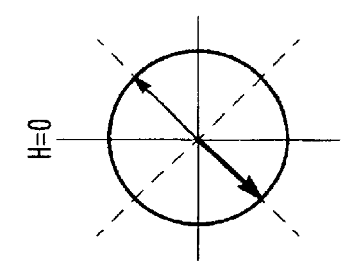
FIG. 18–23 are illustrations of the movement of the magnetic moments during the toggle write of FIG. 17 that results in a change in the value of the MRAM element.
Figure 19:
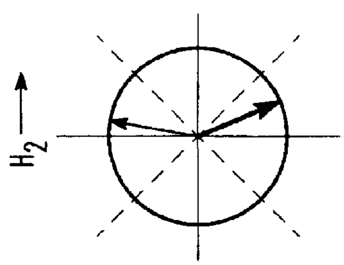
Figure 20:
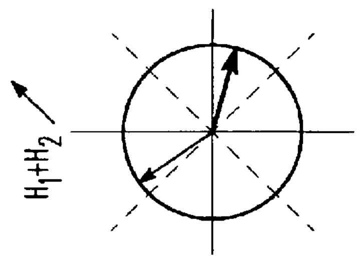
Figure 21:
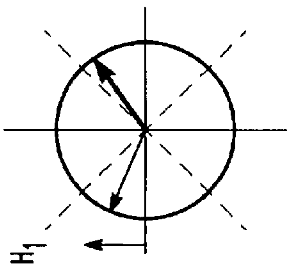
Figure 22:
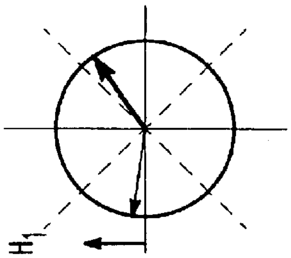
Figure 23:
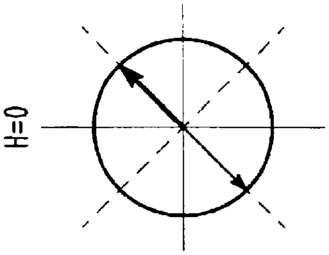
Figure 24:
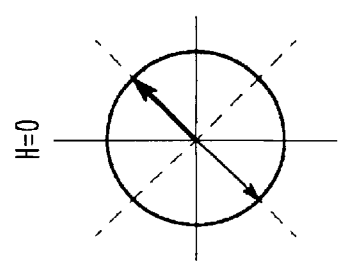
FIG. 24–29 are additional illustrations of the movement of the magnetic moments during the toggle write of FIG. 17 that results in a change in the value of the MRAM element.
Figure 25:
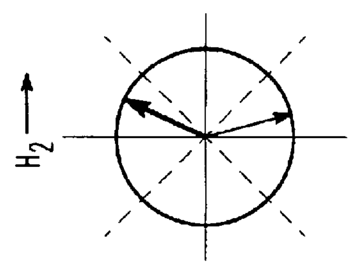
Figure 26:
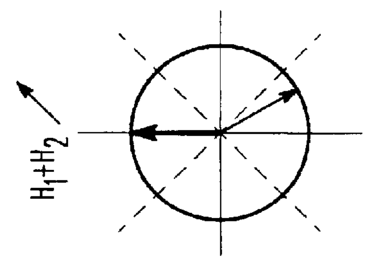
Figure 27:
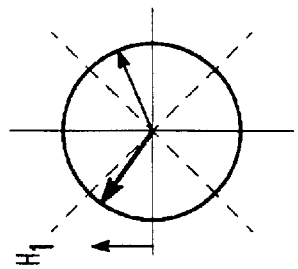
Figure 28:
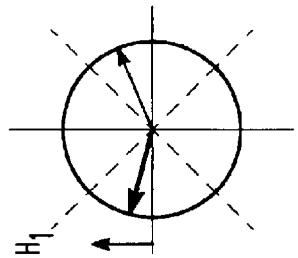
Figure 29:
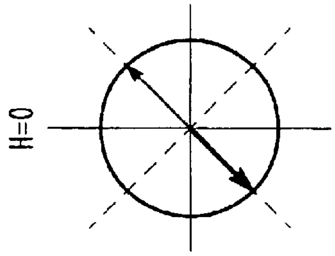
Figure 31:
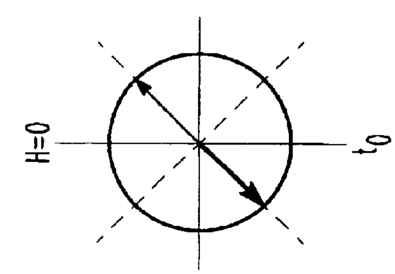
FIG. 31–35 are illustrations of the movement of the magnetic moments during the toggle write of FIG. 30 that results in a change in the value of the MRAM element.
Figure 32:
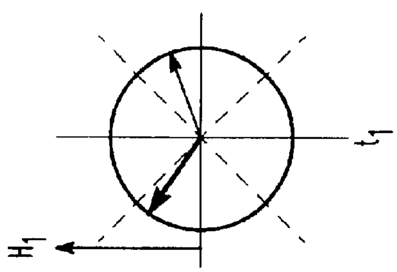
Figure 33:
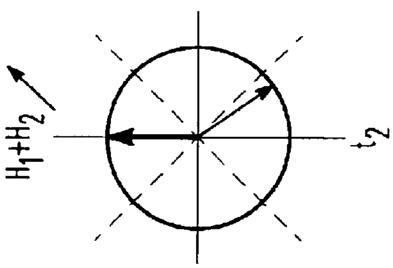
Figure 34:
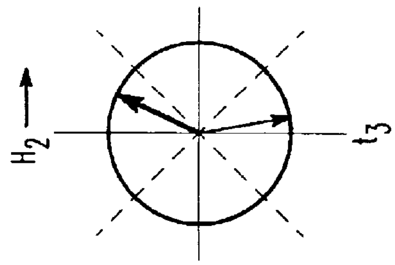
Figure 35:
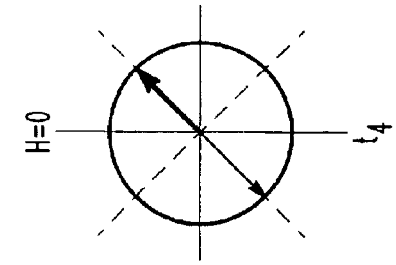
Figure 36:
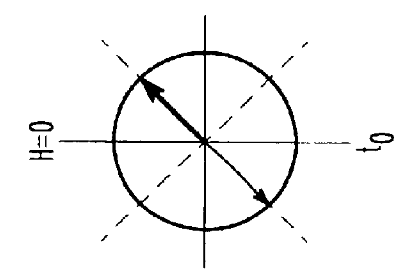
FIG. 36–40 are additional illustrations of the movement of the magnetic moments during the toggle write of FIG. 30 that results in a change in the value of the MRAM element.
Figure 37:
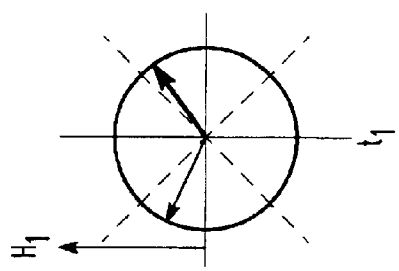
Figure 38:
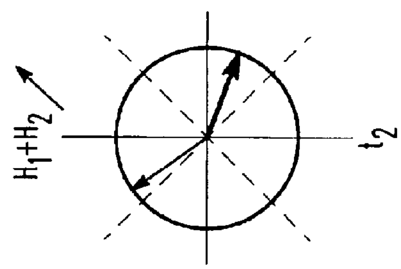
Figure 39:
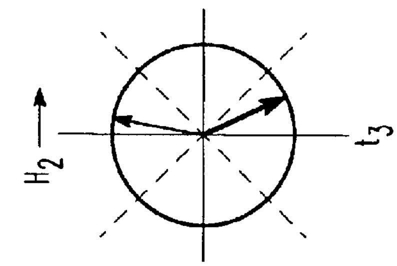
Figure 40:
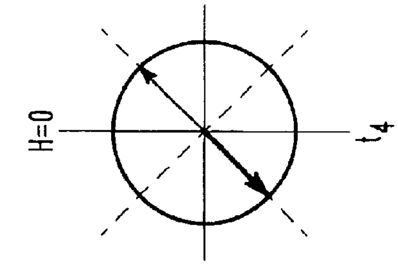

Referring to FIG. 30, another sequence is illustrated for generating magnetic fields with the application of currents to perform the toggle write (TW) in equation (2) and equation (3), which is conducted after the direct write sequence is conducted as previously described with reference to FIG. 4. A bit magnetic field having a first bit magnitude ($|H_{B1}|$) 210 is produced at a first time ($t_1$) 212 with the introduction of a current in the bit line and a word magnetic field having a first word magnitude ($|H_{W1}|$) 214 is produced at a second time ($t_2$) 216. After the word magnetic field having the first word magnitude ($|H_{W1}|$) 214 is produced at the second time ($t_2$) 216, the current in the bit line current is adjusted to reduce the bit magnetic field to a second bit magnitude ($|H_{B2}|$) 218 at a third time ($t_3$) 220. The second bit magnitude ($|H_{B2}|$) 218 is preferably less than about fifty percent (50%) of the first bit magnitude ($|H_{B1}|$) 210, more preferably less than about twenty-five percent (25%) of the first bit magnitude ($|H_{B1}|$) 210, and even more preferably less than about five percent (5%) of the first bit magnitude ($|H_{B1}|$) 210. Once the bit magnetic field is reduced to the second word bit ($|H_{B2}|$) 218, the current in the word line is adjusted to reduce the word magnetic field to a second word magnitude ($|H_{W2}|$) 222 at a fourth time ($t_4$) 224. The second word magnitude ($|H_{W2}|$) 222 is preferably less than about fifty percent (50%) of the first word magnitude ($|H_{W1}|$) 214, more preferably less than about twenty-five percent (25%) of the first word magnitude ($|H_{W1}|$) 214, and even more preferably less than about five percent (5%) of the first word magnitude ($|H_{W1}|$) 214, and this reduction completes the toggle sequence, which rotates the free magnetic layer in a manner as shown in FIGS. 31–35 or 36–40 to provide the second binary value.

Figure 41:
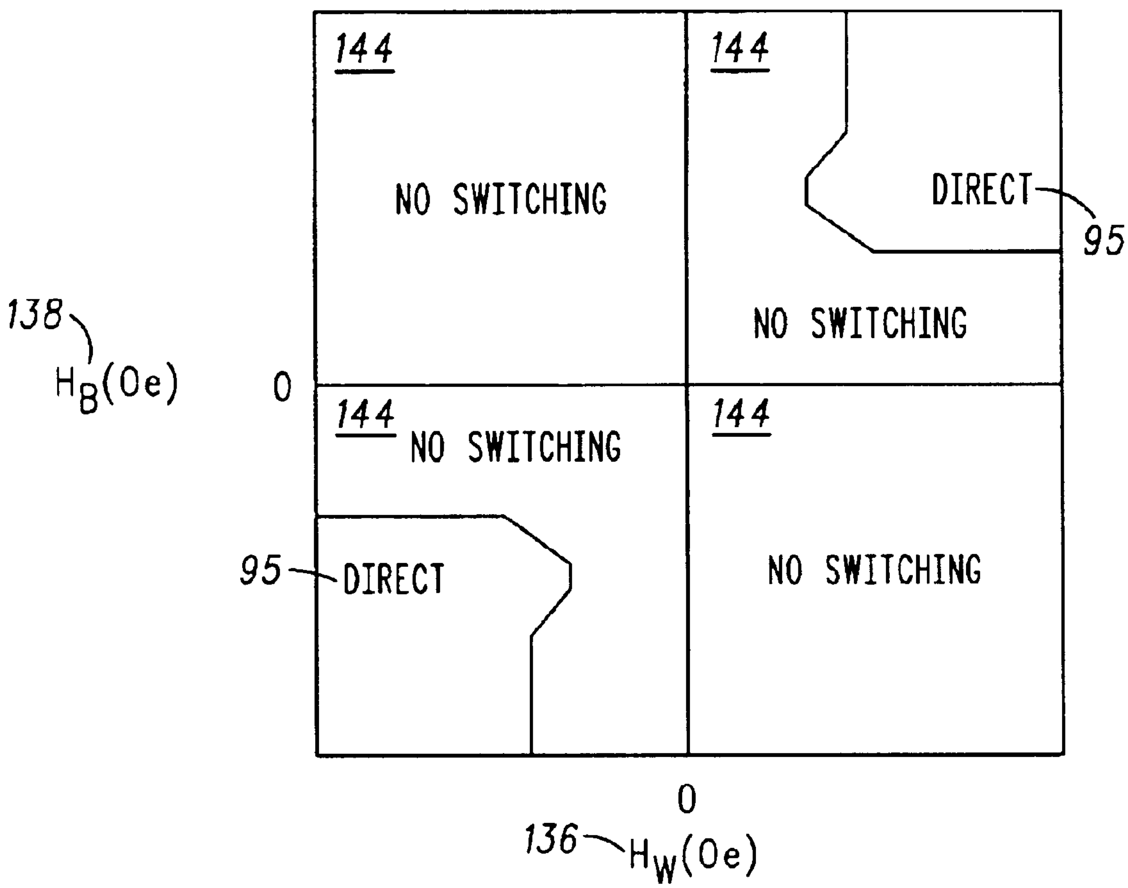
FIG. 41 is graph illustrating magnetic field combinations with the application of the bias field.

As can be appreciated by those of ordinary skill in the art, a combination of the foregoing direct writes or a combination of the direct write and the toggle write as previously described provide for a write sequence without a read sequence. Without intending to be bound by any expressed or implied theory, it is believed that the adjustment of the current in the bit line to reduce the bit magnetic field to a second bit magnitude ($|H_{B2}|$) 178 as shown in FIG. 4 provides a bias field during the direct write that couples to the net magnetic moment of the free magnetic region. The bias field cases the MTJ to have a preferred magnetization state when the magnetic moment is aligned with the bias field. The bias field then eliminates the possibility of a toggle event since the net moment is going against the applied bias field in this case. Therefore, with the application of the bias field, the pulse sequences described in this detailed description will have the preferred magnetization state as the end result, and the direct write regions as shown in FIG. 3 are effectively extended as shown in FIG. 41. Accordingly, a direct write can be conducted to place the MTJ in a known magnetization state and a toggle write can be conducted to place the MTJ in the other magnetization state if this other magnetization state is sought.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

We claim:

1. A magnetoelectronics information device, comprising:

a free magnetic region;

a pinned magnetic region; and a tunneling barrier interposed between said free magnetic region and said pinned magnetic region, wherein magnetic moments of said free magnetic region and said pinned magnetic region that are adjacent to said tunneling barrier are oriented to provide a first magnetization state when:

a first magnetic field with a first field magnitude is produced in proximity to the magnetoelectronics information device at a first time ($t_1$);

a second magnetic field with a second field magnitude is produced in proximity to the magnetoelectronics information device at a second time ($t_2$);

said first magnetic field is adjusted to provide a third field magnitude that is less than said first field magnitude and greater than zero at a third time ($t_3$);

said second magnetic field is adjusted to provide a fourth field magnitude that is less than said second field magnitude at a fourth time ($t_4$); and said first magnetic field is adjusted to provide a fifth field magnitude that is less than said third field magnitude at a fifth time ($t_5$), wherein $t_1<t_3<t_5$.

2. The magnetoelectronics information device of claim 1, wherein $t_1<t_2<t_3<t_4<t_5$.

3. The magnetoelectronics information device of claim 1, wherein said fifth field magnitude is approximately zero.

4. The magnetoelectronics information device of claim 1, wherein said magnetic moment of said free magnetic region is preferably unbalanced.

5. The magnetoelectronics information device of claim 4, wherein shall mean that the fractional balance ratio ($M_{br}$) is in the range of about five hundredths (0.05) to about one tenth (0.1).

6. The magnetoelectronics information device of claim 1, wherein said magnetic moments of said free magnetic region and said pinned magnetic region that are adjacent to said tunneling barrier are oriented to provide a second magnetization state when:

a third magnetic field with a sixth field magnitude is produced in proximity to the magnetoelectronics information device at a sixth time ($t_6$)

a fourth magnetic field with a seventh magnitude is produced in proximity to the magnetoelectronics information device at a a seventh time ($t_7$);

said third magnetic field is adjusted to provide an eighth field magnitude that is less than said sixth magnitude at an eighth time ($t_8$); and said fourth magnetic field is adjusted to provide a ninth field magnitude that is less than said seventh magnitude at a ninth time ($t_9$).

7. The magnetoelectronics information device of claim 6, wherein $t_5<t_6<t_7<t_8<t_9$.

8. The magnetoelectronics information device of claim 6, wherein $t_5<t_7<t_6<t_9<t_8$.

9. The magnetoelectronics information device of claim 1, wherein said magnetic moments of said free magnetic region and said pinned magnetic region that are adjacent to said tunneling barrier are oriented to provide a second magnetization state when:

a third magnetic field with a sixth field magnitude is produced in proximity to the magnetoelectronics information device at a sixth time ($t_6$);

a fourth magnetic field with a seventh field magnitude is produced in proximity to the magnetoelectronics information device at a seventh time ($t_7$);

said third magnetic field is adjusted to provide an eighth magnitude that is less than said sixth magnitude at an eighth time ($t_8$);

said fourth magnetic field is adjusted to provide a ninth field magnitude that is less than said seventh magnitude and greater than zero at a ninth time ($t_9$); and said fourth magnetic field is adjusted to provide a tenth field magnitude that is less than said ninth field magnitude at a tenth time ($t_{10}$).

10. The magnetoelectronics information device of claim 9, wherein $t_5<t_6<t_7<t_8<t_9<t_{10}$.

11. The magnetoelectronics information device of claim 9, wherein said ninth field magnitude is approximately zero.

12. The magnetoelectronics information device of claim 1, wherein said free magnetic region comprises:

a first ferromagnetic layer;

a second ferromagnetic layer; and a non-magnetic layer interposed between said first ferromagnetic layer and said second ferromagnetic layer.

13. The magnetoelectronics information device of claim 12, wherein said first ferromagnetic layer is at least partially formed of one material selected from the group comprising nickel (Ni), iron (Fe), or cobalt (Co).

14. The magnetoelectronics information device of claim 13, wherein said second ferromagnetic layer is at least partially formed of one material selected from the group comprising nickel (Ni), iron (Fe), or cobalt (Co).

15. The magnetoelectronics information device of claim 1, wherein said non-magnetic layer is at least partially formed of one material selected from the group ruthenium (Ru), osmium (Os), rhenium (Re), chromium (Cr), rhodium (Rh), or copper (Cu).

16. The magnetoelectronics information device of claim 1, wherein said pinned magnetic region comprises an anti-ferromagnetic layer adjacent to a ferromagnetic layer.

17. The magnetoelectronics information device of claim 16, wherein said anti-ferromagnetic layer is at least partially formed of one material selected from the group comprising iridium manganese iridium manganese (IrMn), iron manganese (FeMn), rhodium manganese (RhMn), platinum manganese (PtMn), and platinum palladium manganese (PtPdMn).

18. The magnetoelectronics information device of claim 1, wherein said magnetoelectronics information device is an MRAM element.

19. The magnetoelectronics information device of claim 1, wherein said third field magnitude is less that about seventy-five percent (75%) of the first field magnitude and greater than about twenty five percent (25%) of the first field magnitude.

20. The magnetoelectronics information device of claim 1, wherein said third field magnitude is about fifty percent (50%) of the first field magnitude.

21. In a magnetoelectronics information device having a free magnetic region, a pinned magnetic region and a tunneling barrier interposed between said free magnetic region and said pinned magnetic region, a method for writing the magnetoelectronics information device comprising the steps of:

producing a first magnetic field with a first field magnitude in proximity to the magnetoelectronics information device at a first time ($t_1$);

producing a second magnetic field with a second field magnitude in produced in proximity to the magnetoelectronics information device at a second time ($t_2$);

adjusting said first magnetic field to provide a third field magnitude at a third time ($t_3$) that is less than said first field magnitude and greater than zero; and adjusting said second magnetic field to provide a fourth field magnitude at a fourth time ($t_4$) that is less than said second magnitude;

adjusting said first magnetic field to provide a fifth field magnitude that is less than said third field magnitude at a fifth time ($t_5$), wherein $t_1<t_3<t_5$.

22. The method for writing the magnetoelectronics information device of claim 21, wherein $t_1<t_2<t_3<t_4<t_5$.

23. The method for writing the magnetoelectronics information device of claim 21, wherein said fifth magnitude is approximately zero.

24. The method for writing the magnetoelectronics information device of claim 21, further comprising the steps of:

adjusting a third magnetic field to provide a sixth field magnitude in proximity to the magnetoelectronics information device at a sixth time ($t_6$);

adjusting a fourth magnetic field to provide a seventh field magnitude in proximity to the magnetoelectronics information device at a seventh time ($t_7$);

adjusting said third magnetic field to provide an eighth field magnitude that is less than said sixth field magnitude at an eighth time ($t_8$); and adjusting said fourth magnetic field to provide a ninth field magnitude that is less than said seventh field magnitude at a ninth time ($t_9$).

25. The method for writing the magnetoelectronics information device of claim 24, wherein $t_5<t_6<t_7<t_8<t_9$.

26. The method for writing the magnetoelectronics information device of claim 24, wherein $t_5<t_7<t_6<t_9<t_8$.

27. The method for writing the magnetoelectronics information device of claim further comprising the steps of:

adjusting a third magnetic field to provide a sixth field magnitude in proximity to the magnetoelectronics information device at a sixth time ($t_6$);

adjusting a fourth magnetic field to provide a seventh field magnitude in proximity to the magnetoelectronics information device at a seventh time ($t_7$);

adjusting said third magnetic field to provide an eighth magnetic field that is less than said sixth field magnitude at an eighth time ($t_8$);

adjusting said fourth magnetic field to provide a ninth field magnitude that is less than said seventh field magnitude and greater than zero at a ninth time ($t_9$); and adjusting said fourth magnetic field to provide a tenth field magnitude that is less than said ninth field magnitude at a tenth time ($t_{10}$).

28. The magnetoelectronics information device of claim 27, wherein $t_5<t_6<t_7<t_8<t_9<t_9$.

29. The magnetoelectronics information device of claim 27, wherein said tenth field magnitude is approximately zero.

30. The magnetoelectronics information device of claim 21, wherein said magnetoelectronics information device is an MRAM element.

31. The magnetoelectronics information device of claim 21, wherein said third field magnitude is less that about seventy-five percent (75%) of the first field magnitude and greater than about twenty five percent (25%) of the first field magnitude.

32. The magnetoelectronics information device of claim 21, wherein said third field magnitude is about fifty percent (50%) of the first field magnitude.

33. A MRAM element, comprising:

a free magnetic region comprising a first ferromagnetic layer, a second ferromagnetic layer and a non-magnetic layer interposed between said first ferromagnetic layer and said second ferromagnetic layer;

a pinned magnetic region magnetically coupled to said free magnetic region, said pinned magnetic region comprising a third ferromagnetic layer and an anti-ferromagnetic layer; and a tunneling barrier interposed between said free magnetic region and said pinned magnetic region, wherein a magnetic moment of said free magnetic region is unbalanced and magnetic moments of said free magnetic region and said pinned magnetic region that are adjacent to said tunneling barrier are oriented to provide a first magnetization state when:

a first magnetic field with a first field magnitude is produced in proximity to the MRAM element at a first time ($t_1$);

a second magnetic field with a second field magnitude is produced in proximity to the MRAM element at a second time ($t_2$);

said first magnetic field is adjusted to provide a third field magnitude that is less than said first field magnitude and greater than zero at a third time ($t_3$); and said second magnetic field is adjusted to provide a fourth field magnitude that is less than said second field magnitude at a fourth time ($t_4$);

said first magnetic field is adjusted to provide a fifth field magnitude that is less than said third field magnitude at a fifth time ($t_5$), wherein $t_1<t_3<t_5$.

* * * * *